(12) United States Patent
Fujimori

(10) Patent No.: US 8,614,037 B2
(45) Date of Patent: Dec. 24, 2013

(54) DYE-CONTAINING NEGATIVE WORKING CURABLE COMPOSITION, COLOR FILTER AND METHOD OF PRODUCING THEREOF

(75) Inventor: Toru Fujimori, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 1860 days.

(21) Appl. No.: 11/653,917

(22) Filed: Jan. 17, 2007

(65) Prior Publication Data

US 2007/0166631 A1    Jul. 19, 2007

(30) Foreign Application Priority Data

| Jan. 17, 2006 | (JP) | 2006-008682 |
| Jan. 17, 2006 | (JP) | 2006-008683 |
| May 15, 2006 | (JP) | 2006-135521 |
| May 15, 2006 | (JP) | 2006-135522 |

(51) Int. Cl.
*G02B 5/20*    (2006.01)
*G03F 7/00*    (2006.01)

(52) U.S. Cl.
USPC .......................................... 430/7; 430/288.1

(58) Field of Classification Search
None
See application file for complete search history.

(56) References Cited

U.S. PATENT DOCUMENTS

2005/0250024 A1* 11/2005 Fujimori ........................ 430/7

FOREIGN PATENT DOCUMENTS

| JP | 6-75375 A | 3/1994 |
| JP | 09-230126 A | 9/1997 |
| JP | 10-332929 A | 12/1998 |
| JP | 11-181042 A | 7/1999 |
| JP | 2001-042521 A | 2/2001 |
| JP | 2001-233842 A | 8/2001 |
| JP | 2004-341121 A | 12/2004 |
| JP | 2005-148717 A | * 6/2005 |

OTHER PUBLICATIONS

Computer-generated translation of JP 2005-148717 (Jun. 2005).*
Japanese Office Action issued in corresponding JP Application No. 2006-135522, dated Jan. 18, 2011.

* cited by examiner

*Primary Examiner* — John A. McPherson
(74) *Attorney, Agent, or Firm* — Sughrue Mion, PLLC

(57) ABSTRACT

The invention provides a dye-containing negative working curable composition comprising at least a dye, a photo polymerization initiator, and as a radical polymerizable monomer, (C-1) an acidic group-containing polyfunctional (meth)acrylic compound having an acid value of 25 mgKOH/g or more, or (C-1) the acidic group-containing polyfunctional (meth)acrylic compound in combination with (C-2) another radical polymerizable compound other than (C-1).

33 Claims, No Drawings

DYE-CONTAINING NEGATIVE WORKING CURABLE COMPOSITION, COLOR FILTER AND METHOD OF PRODUCING THEREOF

CROSS-REFERENCE TO RELATED APPLICATION

This application claims priority under 35 USC 119 from Japanese patent Application Nos. 2006-8683, 2006-135521, 2006-8682, 2006-135522, the disclosures of which are incorporated by reference herein.

BACKGROUND OF THE INVENTION (i) Field of the Invention

The invention relates to a dye-containing negative working curable composition constituting a color filter used for liquid crystal display elements and solid state image pick-up elements and suitable for forming colored images, as well as to a color filter using the dye-containing negative working curable composition and a method of producing thereof.

(ii) Description of the Related Art

As processes for producing a color filter used for liquid crystal display elements (LCD) and solid state image pick-up elements (CCD, CMOS and the like), a staining process, a printing process, an electrodeposition process and a pigment dispersion process are known.

In the pigment dispersion process, the color filter is produced by a photolithographic process using a colored radiation-sensitive composition prepared by dispersing a pigment in a photosensitive composition. The color filter produced by this process is stable with respect to light, heat and the like since pigments are used. A sufficient degree of positional accuracy can be obtained in this process since the pigment is patterned by the photolithographic process, and this process has been widely used as a process suitable for preparing the color filter for a large screen and high-resolution color display.

In producing a color filter by the pigment dispersion process, the radiation-sensitive composition is first coated on a glass substrate with a spin coater or roll coater and dried to form a coated film. Then, colored picture elements are obtained by patterned-exposure and development of the coated film. The color filter can be produced by repeating this operation a number of times corresponding to the number of hues.

As the pigment dispersion process, a negative photosensitive composition in which photopolymerizable monomer and photopolymerization initiator are combined with alkali soluble resin is described (e.g., see Japanese Patent Application Laid-Open (JP-A) Nos. 2-181704, 2-199403, 5-273411, and 7-140654).

Recently, in the color filter for solid state image pick-up elements, even higher resolution is desired, but the conventional pigment dispersions have difficulties in further improving the resolution. Because of the problem such as generation of color irregularities due to coarse particles of the pigment, it is not suitable for the use which requires fine patterns such as solid state image pick-up elements.

Due to those problems, a technique of using a dye instead of the conventional pigment has been suggested (e.g., see Japanese Patent Application Laid-Open (JP-A) Nos. 6-75375).

SUMMARY OF THE INVENTION

However, curable compositions using a dye have problems in that dye solubility is inferior and in that dyes are generally inferior to pigments in terms of capabilities such as light-fastness, thermal resistance, and coating uniformity.

Further, in the case of using the composition for producing solid state image pick-up elements, since a film thickness of 1.0 μm or less is required, a large amount of a coloring material has to be added in the curable composition, and accordingly, adhesiveness to a support and curability may become insufficient or the dye may be expelled in an exposed part forming a filter, whereby pattern formability tends to be considerably deteriorated.

The invention has been made in light of the above-mentioned situation, and provides a dye-containing negative working curable composition suitable for a constitution in which a dye is used as a coloring agent, having high sensitivity, and usable for forming fine patterns with rectangular cross-sectional shapes. The invention also provides a color filter (particularly a color filter for a solid state image pick-up element) capable of being produced at high productivity (high cost performance) and having patterns with high sharpness (particularly, whose cross-sectional shape is a good rectangular shape) and high resolution, and a method of producing the same.

A first aspect of the invention provides a dye-containing negative working curable composition comprising (A) a dye, (B) a photo polymerization initiator, and (C) an acidic group-containing polyfunctional (meth)acrylic compound having an acid value of 25 mgKOH/g or more as a radical polymerizable monomer.

A second aspect of the invention provides a dye-containing negative working curable composition comprising at least (A) a dye, (B) a photo polymerization initiator, and (C) a radical polymerizable monomer, wherein the radical polymerizable monomer (C) comprises at least (C-1) an acidic group-containing polyfunctional (meth)acrylic compound having an acid value of 25 mgKOH/g or more and (C-2) another radical polymerizable compound other than (C-1).

A third aspect of the invention provides a color filter formed by using the dye-containing negative working curable composition according to the first aspect or the second aspect.

A fourth aspect of the invention provides a method of producing a color filter comprising: coating the dye-containing negative working curable composition according to the first aspect or the second aspect onto a support; then exposing through a mask; and developing to form a pattern image.

DETAILED DESCRIPTION OF THE INVENTION

Hereinbelow, the dye-containing curable composition, the color filter and the method of producing thereof of the invention will be described in detail.

<<Dye-Containing Negative Working Curable Composition>>

The dye-containing negative working curable composition of the invention contains at least (A) a dye, (B) a photo polymerization initiator, and (C) a radical polymerizable monomer.

In the invention, the dye-containing negative working curable composition of a first embodiment contains (C-1) an acidic group-containing polyfunctional (meth)acrylic compound having an acid value of 25 mgKOH/g or more as the radical polymerizable monomer (C). In this embodiment, in particular, selection of the acidic group-containing polyfunctional (meth)acrylic compound having an acid value of 25 mgKOH/g or more provides higher sensitivity and is effective to form fine patterns with a good rectangular shape.

Further, the dye-containing negative working curable composition of a second embodiment contains at least (C-1) an acidic group-containing polyfunctional (meth)acrylic compound having an acid value of 25 mgKOH/g or more and (C-2) another radical polymerizable compound other than (C-1) as the radical polymerizable monomer (C). In this embodiment, the combined use of the acidic group-containing polyfunctional (meth)acrylic compound having an acid value of 25 mgKOH/g or more and another radical polymerizable compound other than the former compound (C-1) provides higher sensitivity and is effective to form fine patterns with a good rectangular shape.

Further, the dye-containing negative working curable composition may generally contain (E) an organic solvent and preferably may further contain (D) a binder resin. Further, if necessary, the composition may contain other components such as a cross-linking agent.

(A) Dye

The dye-containing negative working curable composition of the invention contains at least one kind dye. The dye may be used without any particular limitation and may be selected from known dyes used conventionally for color filters. Among dyes are preferred organic solvent-soluble dyes having solubility in an organic solvent.

The dyes available include dyes described in JP-A Nos. 64-90403, 64-91102, 1-94301, 6-11614, 5-333207, 6-35183, 6-51115 and 6-194828; Japanese Patent No. 2592207; and U.S. Pat. Nos. 4,808,501, 5,667,920 and 5,059,500.

As the chemical structure, dyes based on azos such as pyrazole azo, anilinoazo, arylazo, pyrazolotriazole azo and pyridone azo, triphenylmethane, anthraquinone, anthrapyridone, benzylidene, oxonol, cyanine, phenothiazine, pyrrolopyrazole azomethine, xanthene, phthalocyanine, benzopyran, indigo, and the like can be used. Dyes based on azos such as pyrazole azo, anilinoazo, pyrazolotriazole azo and pyridone azo, anthraquinone, and anthrapyridone are particularly preferred.

When the composition is formulated as a resist system for developing with water or an alkali, at least one kind selected from acid dyes and derivatives thereof may be suitably used from the viewpoint of completely removing the binder and dye by development. Otherwise, it is preferable to use at least one of the dye appropriately selected from direct dyes, basic dyes, mordant dyes, acid mordant dyes, azoic dyes, disperse dyes, oil soluble dyes and food dyes, and derivatives thereof.

The acid dye and derivatives thereof will be described below.

—Acid Dye and Derivatives Thereof—

The acid dye is not particularly restricted, so long as it is a dye having acidic groups such as sulfonic acid, carboxylic acid and phenolic hydroxyl groups. However, the acid dye should be selected considering all required characteristics such as solubility in the organic solvent and developer used for development, salt forming ability with basic compounds, light absorbance, interact with other component in the curable composition, light fastness, and thermal resistance, and the like.

acid alizarin violet N;
acid black 1, 2, 24, 48;
acid blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335, 340;
acid chrome violet K;
acid Fuchsin;
acid green 1, 3, 5, 9, 16, 25, 27, 50, 58, 63, 65, 80, 104, 105, 106, 109;
acid orange 6, 7, 8, 10, 12, 26, 50, 51, 52, 56, 62, 63, 64, 74, 75, 94, 95, 107, 108, 169, 173;
acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 195, 308, 312, 315, 316, 339, 341, 345, 346, 349, 382, 383, 394, 401, 412, 417, 418, 422, 426;
acid violet 6B, 7, 9, 17, 19;
acid yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, 251;
Direct Yellow 2, 33, 34, 35, 38, 39, 43, 47, 50, 54, 58, 68, 69, 70, 71, 86, 93, 94, 95, 98, 102, 108, 109, 129, 136, 138, 141;
Direct Orange 34, 39, 41, 46, 50, 52, 56, 57, 61, 64, 65, 68, 70, 96, 97, 106, 107;
Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, 250;
Direct Violet 47, 52, 54, 59, 60, 65, 66, 79, 80, 81, 82, 84, 89, 90, 93, 95, 96, 103, 104;
Direct Blue 57, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275, 293;
Direct Green 25, 27, 31, 32, 34, 37, 63, 65, 66, 67, 68, 69, 72, 77, 79, 82;
Mordant Yellow 5, 8, 10, 16, 20, 26, 30, 31, 33, 42, 43, 45, 56, 50, 61, 62, 65;
Mordant Orange 3, 4, 5, 8, 12, 13, 14, 20, 21, 23, 24, 28, 29, 32, 34, 35, 36, 37, 42, 43, 47, 48;
Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94, 95;
Mordant Violet 2, 4, 5, 7, 14, 22, 24, 30, 31, 32, 37, 40, 41, 44, 45, 47, 48, 53, 58;
Mordant Blue 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, 84;
Mordant Green 1, 3, 4, 5, 10, 15, 19, 26, 29, 33, 34, 35, 41, 43, 53;
Food Yellow 3;
and derivatives of these dyes.

Among these, acid black 24; acid blue 23, 25, 29, 62, 80, 86, 87, 92, 138, 158, 182, 243, 324:1; acid orange 8, 51, 56, 74, 63, 74; acid red 1, 4, 8, 34, 37, 42, 52, 57, 80, 97, 114, 143, 145, 151, 183, 217, 249; acid violet 7; acid yellow 17, 25, 29, 34, 42, 72, 76, 99, 111, 112, 114, 116, 134, 155, 169, 172, 184, 220, 228, 230, 232, 243; acid green 25; and derivatives thereof are preferred.

Acid dyes based on azos, xanthenes, phthalocyanines other than those described above are preferred. Examples of these dyes include acid dyes such as C.I. solvent blue 44 and 38, C.I. Solvent orange 45, rhodamine B, rhodamine 110, 3-[(5-chloro-2-phenoxyphenyl)hydrazono]-3,4-dihydro-4-oxo-5-[(phenylsulfonyl)amino]-2,7-Naphthalenedisulfonic acid, and derivatives of these dyes.

The derivatives of the acid dye available include inorganic salts of the acid dye having acidic groups such as sulfonic acid and carboxylic acid, salts of the acid dye with nitrogen containing compounds, and sulfonamides of the acid dye, and the like. The derivative is not particularly restricted so long as it is soluble in a solution of the dye-containing negative working curable composition prepared. However, the derivatives of the acid dye should be selected considering of all required characteristics such as solubility in the organic solvent and developer used for development, light absorbance, interact with other component in the curable composition, light fastness, and thermal resistance, and the like.

The salt of the acid dye with the nitrogen-containing compound will be described below. Forming a salt between the acid dye and nitrogen-containing compound may be effective for improving solubility (solubility in organic solvents) of the acid dye, thermal resistance and light-fastness.

The nitrogen containing compound that forms a salt with the acid dye, and the nitrogen containing compound that forms an amide bond with the acid dye are selected considering all the characteristics such as solubility of the salt or amide compound in the organic solvent or the developer used for development, salt forming ability, light absorbance, color value of the dye, interaction between the nitrogen containing compound and other components in the curable composition, and thermal resistance and light-fastness as a coloring agent. The molecular weight of the nitrogen-containing compound is preferably as small as possible when the compound is selected considering only the light absorbance and color value. The molecular weight is preferably 300 or less, more preferably 280 or less, and particularly preferably 250 or less.

The molar ratio of nitrogen-containing compound/acidic dye (hereinafter, abbreviated as n) in "the salt of an acidic dye and a nitrogen-containing compound" will be described. The reference character n is a value determining the molar ratio of the acidic dye molecule and the nitrogen-containing compound (an amine compound) forming a counter ion with the acidic dye molecule and may be selected optionally in accordance with the acidic dye-amine compound salt formation condition. Specifically, the numerical value n between a range of $0 < n \leq 5$ as the number of the functional groups in the acid of the acidic dye is employed in many cases and is selected in consideration of all of the needed properties; the solubility in an organic solvent and a developer, the salt formability, the absorbance, interaction with another component in the curable composition, light-fastness, and thermal resistance. In the case of selection in consideration of only the absorbance, the above-mentioned numerical value n is preferably selected in a range of $0 < n \leq 4.5$; more preferably selected in a range of $0 < n \leq 4$; and particularly preferably selected in a range of $0 < n \leq 3.5$.

Since the above-mentioned acidic dye becomes acidic by introducing the acidic group into the structure, the dye can be made contrarily a non-acidic dye by changing the substituent group. That is, the acidic dye sometimes works preferably at the time of alkaline development, however in some cases it causes over-development and therefore, a non-acidic dye is preferably used in some cases. Examples of the non-acidic dye to be used are those having no acidic group for the above-exemplified acidic dyes.

With respect to the above-mentioned dyes, monochromatic dyes may be used in the case where the dyes compose yellow, magenta, and cyan, which are additive complementary colors and two or more kinds of dyes may be used in combination in the case where the dyes compose red, green, and blue, which are additive primary colors. In the invention, additive mixture systems (mixtures) of at least two kinds of dyes having different absorption characteristics in combination are preferably used to form preferable color hue of the primary color system.

Although differing in accordance with the type, the content of the dye in the dye-containing negative working curable composition is preferably in a range of 0.5 to 80% by mass and more preferably in a range of 10 to 60% by mass, based on the total solid contents in the composition. In the case where two or more kinds of dyes are mixed to adjust the color, the content of the dye whose addition amount is the minimum is preferably 10% or more in 100% total dye amount.

(B) Photopolymerization Initiator

The dye-containing negative working curable composition of the invention contains at least one kind photopolymerization initiator. The photopolymerization initiator can polymerize and cure a polymerizable monomer to be hereinafter described, in case of constituting the dye-containing negative working curable composition of the invention.

The photopolymerization initiator is not restricted particularly so long as it can polymerize the polymerizable monomer. The photopolymerization initiator is preferably selected with a view point of the characteristic, initiation efficiency, absorption wavelength, availability, cost, and the like.

Examples of the photopolymerization initiator include at least one of an active halogen compound selected from halomethyl oxadiazole compounds and halomethyl-s-triazine compounds, 3-aryl substituted coumarin compound, a rofin dimmer, a benzophenone compound, an acetophenone compound and derivatives thereof, cyclopentadiene-benzene-iron complexe and salt thereof, and an oxime-based compound, and the like.

Examples of the active halogen compound such as the halomethyl oxadiazol compound described above include 2-halomethyl-5-vinyl-1,3,4-oxadiazole compound and the like, described in JP-B No. 57-6096, 2-trichloromethyl-5-styryl-1,3,4-oxadiazole, 2-trichloromethyl-5-(p-cyanostyryl)-1,3,4-oxadiazole, 2-trichloromethyl-5-(p-methoxystyryl)-1,3,4-oxadiazole, and the like.

Further, Examples of the halomethyl-s-triazine compounds described above include a vinyl halomethyl-s-triazine compound described in JP-B No. 59-1281, 2-(naphtho-1-yl)-4,6-bis-halomethyl-s-triazine compound, and 4-(p-aminophenyl)-2,6-di-halomethyl-s-triazine compound described in JP-A No. 53-133428.

Examples specifically include 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphtho-1-yl)-4,6-bis-trichloromethyl-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-[4-(2-methoxyethyl)-naphtho-1-yl]-4,6-bis-trichloromethyl-s-triazine, 2-[4-(2-ethoxyethyl)-naphtho-1-yl]-4,6-bis-trichloromethyl-s-triazine, 2-[4-(2-butoxyethyl)-naphto-1-yl]-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromehtyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl)-4,6-bis-trichloromethyl-s-triazine, 2-(4,5-dimethoxy-naphtho-1-yl)-4,6-bis-trichloromethyl-s-triazine, 4-[p-N,N-di(ethoxycarbonylmethyl)aminophenly]-2,6-di(trichloromethyl)-s-triazine, 4-[o-methyl-p-N,N-di(ethoxycarbonylmethyl)aminophenyl]2,6-di (trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloroethyl)-s-triazine, 4-(p-N-chloroethylaminophenly)-2,6-di(trichloromethyl)-s-triazine, 4-(p-N-ethoxycarbonylmethylaminophenol)-2,6-di(trichloromethyl)-s-triazine, 4-[p-N,N-di(phenyl)aminophenyl]-2,6-di(trichloromethyl)-s-triazine, 4-(p-N-chloroethylcarbonylaminophenyl)-2,6-di(trichloromethyl)-s-triazine, 4-[p-N-(p-mehtoxyphenyl)carmonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[o-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminohenyl]-2,6-di(trichloromethyl)-s-triazine, 4-[m-bromo-p-N,N-di(chloroethyl)aminohenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethyl-aminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, and 4-(o-fluoro-p-N-chloroethylaminophenyl)-2,6-di(trichloromethyl)-s-triazine.

In addition, TAZ-107, TAZ-110, TAZ-104, TAZ-109, TAZ-140, TAZ-204, TAZ-113, and TAZ-123, as TAZ series manufactured by Midori Kagaku Co., Ltd., T-OMS, T-BMP, T-R, and T-B, as T-series manufactured by Panchim Co., Ltd., Irgacure 651, Irgacure 184, Irgacure 500, Irgacure 1000, Irgacure 149, Irgacure 819, Irgacure 261, as the Irgacure series, Darocure 1173 as the Darocure series, manufactured by Ciba Speciality Chemicals Co., 4,4'-bis(diethylamino)-benzophenone, 2-benzyl-2-dimethylamino-4-morpholinobutyrophenone, 2,2-dimethoxy-2-phenylacetophenone, 2-(o-chlorophenyl)-4,5-diphenyl imidazolyl dimer, 2-(o-fluorophenyl)-4,5-diphenyl imidazolyl dimer, 2-(o-methoxyphenyl)-4,5-diphenyl imidazolyl dimer, 2-(p-methoxyphenyl)-4,5-diphenyl imidazolyl dimer, 2-(p-dimethoxyphenyl)-4,5-diphenyl imidazolyl dimer, 2-(2,4-dimethoxyphenyl)-4,5-diphenyl imidazolyl dimer, 2-(p-methylmercaptophenyl)-4,5-diphenyl imidazolyl dimer, and benzoin isopropyl ether can also be used usefully.

As the above-mentioned oxime-based compounds have been known oxime-based initiators described in JP-A No. 2000-80068, WO-02/100903A1, and JP-A No. 2001-233842. Specific examples include 2-(O-benzoyloxime)-1-[4-(phenylthio)phenyl]-1,2-butanedione, 2-(O-benzoyloxime)-1-[4-(phenylthio)phenyl]-1,2-pentanedione, 2-(O-benzoyloxime)-1-[4-(phenylthio)phenyl]-1,2-hexanedione, 2-(O-benzoyloxime)-1-[4-(phenylthio)phenyl]-1,2-pentanedione, 2-(O-benzoyloxime)-1-[4-(phenylthio)phenyl]-1,2-octanedione, 2-(O-benzoyloxime)-1-[4-(methylphenylthio)phenyl]-1,2-butanedione, 2-(O-benzoyloxime)-1-[4-(ethylphenylthio)phenyl]-1,2-butanedione, 2-(O-benzoyloxime)-1-[4-(butylphenylthio)phenyl]-1,2-butanedione, 1-(O-acetyloxime)-1-[9-ethyl-6-(2-methylbenzoyl)-9H-carbazol-3-yl]ethanone, 1-(O-acetyloxime)-1-[9-methyl-6-(2-methylbenzoyl)-9H-carbazol-3-yl]ethanone, 1-(O-acetyloxime)-1-[9-propyl-6-(2-methylbenzoyl)-9H-carbazol-3-yl]ethanone, 1-(O-acetyloxime)-1-[9-ethyl-6-(2-ethylbenzoyl)-9H-carbazol-3-yl]ethanone, and 1-(O-acetyloxime)-1-[9-ethyl-6-(2-butylbenzoyl)-9H-carbazol-3-yl]ethanone. However, the oxime-based compounds are not limited to these examples.

These photo polymerization initiators may be used alone or two or more of them may be used while being mixed.

Among them, from the viewpoint of the sensitivity, at least one kind of the photo polymerization initiators is preferably the triazine-based photo polymerization initiators or the oxime-based photo polymerization initiators, and most preferably the oxime-based photo polymerization initiators.

From the above-mentioned viewpoint, particularly preferable ones are 2-(O-benzoyloxime)-1-[4-(phenylthio)phenyl]-1,2-octanedione (preferably manufactured by Ciba Specialty Chemicals Inc.), 1-(O-acetyloxime)-1-[9-ethyl-6-(2-methylbenzoyl)-9H-carbazol-3-yl]ethanone (preferably manufactured by Ciba Specialty Chemicals Inc.), and their combination.

Sensitizers and light stabilizers may be used together with these photopolymerization initiators. Specific examples of them include benzoin, benzoin methylether, 9-fluorenone, 2-chloro-9-fluorenone, 2-methyl-9-fluorenone, 9-anthrone, 2-bromo-9-anthrone, 2-ethyl-9-anthrone, 9,10-anthraqunone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acrydone, 10-butyl-2-chloroacrydone, benzyl, dibenzylacetone, p-(dimethylamino)phenylstyrylketone, p-(dimethylamino)phanyl-p-methylstyrrylketone, benzophenone, p-(dimethylamino) benzophenone (or Michler's ketone), p-(diethylamino) benzophenone, benzoanthrone, and benzothiazole compounds described in JP-B No. 51-48516, Tinuvin 1130 and Tinuvin 400.

Known Photopolymerization initiators other than those described above may be used in the dye-containing negative working curable composition of the invention. Examples of them include vicinal polyketolaldonyl compounds described in U.S. Pat. No. 2,367,660, α-carbonyl compounds described in U.S. Pat. Nos. 2,367,661 and 2,367,670, acyloin ether compounds described in U.S. Pat. No. 2,448,828, aromatic acyloin compounds substituted with α-carbohydrates described in U.S. Pat. No. 2,722,512, polynuclear quinone compounds described in U.S. Pat. Nos. 3,046,127 and 2,951, 758, combinations of trially imidazole dimer and p-aminophenyl ketone described in U.S. Pat. No. 3,549,367, and benzothiazole-based compounds/trihalomethyl-s-triazine-based compounds described in JP-B No. 51-48516.

The total content of the photo polymerization initiator (and conventionally known initiator) in the dye-containing negative working curable composition is preferably in a range of 0.01 to 50% by mass, more preferably in a range of 1 to 30% by mass, and particularly preferably in a range of 1 to 20% by mass, based on the solid content (mass) of the radical polymerizable monomer which will be described later. If the content is in the above-mentioned range, polymerization curing can be carried out favorably to avoid that the film strength becomes weak due to low molecular weight in spite of high polymerization degree.

(C) Radical Polymerization Monomer

The dye-containing negative working curable composition of the first embodiment is characterized in that (C-1) at least one kind acidic group-containing polyfunctional (meth)acrylic compound having an acid value of 25 mgKOH/g or more is contained as the radical polymerizable monomer.

Selective use of the polymerizable monomer makes it possible to obtain image patterns with fine and excellent rectangular pattern profiles at a high sensitivity.

Further, the dye-containing negative working curable composition of the second embodiment is characterized in that (C-1) at least one kind acidic group-containing polyfunctional (meth)acrylic compound having an acid value of 25 mgKOH/g or more and (C-2) another radical polymerizable compound other than (C-1) are both contained as the radical polymerizable monomer. In this embodiment, since both of (C-1) and (C-2) are mixed and contained, even the dye-based composition (particularly the dye-based composition containing the dyes in high concentrations) can give image patterns with fine and excellent rectangular pattern profiles at a high sensitivity.

In the second embodiment, the radical polymerizable monomers to be selected from the above-mentioned (C-1) and (C-2) may be optionally combined and mixed.

If these radical polymerizable monomers are added together with a photo polymerization initiator, which will be described later, the dye-containing negative working curable composition of the invention can be constituted as the negative type.

(C-1) Acidic Group-Containing Polyfunctional (Meth)acrylic Compound

The acidic group-containing polyfunctional (meth)acrylic compound is an acidic group-containing polyfunctional (meth)acrylic compound having a boiling point of 100° C. or higher under normal pressure and an acid value of 25 mgKOH/g or more.

The acidic group of the acidic group-containing polyfunctional (meth)acrylic compound is preferably a carboxyl group, a sulfo group, and a phosphoric acid group; more preferably a carboxyl group and a sulfo group; and particularly preferably a carboxyl group.

The above-mentioned acid value is set to be 25 mgKOH/g or more. If the acid value is 25 mgKOH/g or more, it is effective from the viewpoint of the solubility of the unexposed part. Among them, the acid value is preferably in a range of 25 mgKOH/g to 200 mgKOH/g; more preferably in a range of 26 mgKOH/g to 100 mgKOH/g; and even preferably in a range of 50 mgKOH/g to 100 mgKOH/g.

The acid value is measured by an ordinary method. For example, it may be measured by titration using a burette or potentiometric automated measurement apparatus AT-310 (manufactured by Kyoto Denshi Co., Ltd.).

The above-mentioned "acidic group-containing polyfunctional (meth)acrylic compound having a boiling point of 100° C. or higher under normal pressure and an acid value of 25 mgKOH/g or more" is not particularly limited and preferably compounds having 3 or more addition polymerizable ethylenic double bonds. Examples include compounds obtained by introducing the above-mentioned acidic groups (e.g., a carboxyl group or a sulfo group, particularly preferably a carboxyl group) by reaction on hydroxyl groups of hydroxyl-containing pentafunctional acrylic compounds (e.g., compounds obtained by substituting OH groups of dipentaerythritol pentaacrylate with carboxyl group-containing substituent groups).

The acidic group-containing polyfunctional (meth)acrylic compound having an acid value of 25 mgKOH/g or more is further preferably those having a high viscosity and specifically compounds having a viscosity (at 25° C.) of 11,500 mPa·s or higher are preferable. If the viscosity is 11,500 mPa·s or higher, it is effective to adjust the viscosity of a resist solution.

Among them, the viscosity is preferably in a range of 11,500 to 100,000 mPa·s (at 25° C.); more preferably in a range of 12,000 to 100,000 mPa·s (at 25° C.); and particularly preferably in a range of 20,000 to 100,000 mPa·s (at 25° C.).

The viscosity may be measured by an ordinary method while the curable composition is adjusted at 25° C. For example, it may be measured by a rotary type viscometer (e.g., manufactured by Toki Sangyo Co., Ltd.), or a vibration type viscometer (e.g., SV-10 (manufactured by AND Inc.)).

Examples to be used preferably as the acidic group-containing radical polymerizable monomers described above are TO-2359, TO-2360, TO-2348, and TO-2349 manufactured by Toagosei Co., Ltd.

In the first embodiment, from the viewpoint of obtaining image patterns with fine and excellent rectangular pattern profiles at a high sensitivity, the composition of containing the oxime-based photo polymerization initiator and "a compound obtained by introducing an acidic group (e.g., preferably a carboxyl group or a sulfo group, and particularly preferably a carboxyl group) by reaction on hydroxyl groups of a hydroxyl-containing pentafunctional acrylic compound" in combination is preferable, and particularly the composition containing 2-(O-benzoyloxime)-1-[4-(phenylthio)phenyl]-1,2-octanedione, 1-(O-acetyloxime)-1-[9-ethyl-6-(2-methylbenzoyl)-9H-carbazol-3-yl]ethanone (both are manufactured by Ciba Specialty Chemicals Inc.), or both of these two compounds with TO-2359, TO-2360, TO-2348, or TO-2349 manufactured by Toagosei Co., Ltd., or their combination are more preferable.

(C-2) Another Radical Polymerizable Compound

Another radical polymerizable compound other than the above-mentioned acidic group-containing polyfunctional (meth)acrylic compound (C-1) is preferably compounds having a boiling point of 100° C. or higher under normal pressure and at least one addition polymerizable ethylenic double bond and (meth)acryloyl group is preferably as the ethylenic double bond.

Examples of the compounds having a boiling point of 100° C. or higher under normal pressure and at least one (meth)acryloyl group (an addition polymerizable ethylenic double bond) include monofunctional acrylates and methacrylates such as polyethylene glycol mono(meth)acrylate, polypropylene glycol mono(meth)acrylate, phenoxyethyl(meth)acrylate; polyfunctional acrylates and methacrylates such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol(meth)acrylate, trimethylolpropane tri(acryloyloxypropyl)ether, tri(acryloyloxyethyl)isocyanurate, compounds obtained by adding ethylene oxide and propylene oxide to polyfunctional alcohols such as a glycerin, a trimethylolethane, etc., and successively (meth)acrylating the obtained compounds, urethane acrylates described in JP-B Nos. 48-41708, 50-6034, and JP-A No. 51-37193, polyester acrylates described in JP-A No. 48-64183 and JP-B No. 49-43191 and 52-30490, and epoxyacrylates which are reaction products of epoxy resins and (meth)acrylic acid, and their mixtures. Further, examples may include photo-curable monomers and oligomers described in Journal of Adhesion Society of Japan, vol. 20, No. 7, pp. 300-308.

In the second embodiment, preferable combinations of the acidic group-containing polyfunctional (meth)acrylic compound (C-1) and another radical polymerizable compound (C-2) are combinations of TO-2359, TO-2360, TO-2348, TO-2349 manufactured by Toagosei Co., Ltd., or two or more of them with DPHA (dipentaerythritol hexaacrylate, or a mixture of dipentaerythritol hexaacrylate and pentaacrylate; e.g., Kayarad DPHA manufactured by Nippon Kayaku Co., Ltd.; or SR 494 manufactured by Sartomer Co.) and particularly preferably combinations of TO-2359, TO-2360, TO-2348, or TO-2349 with Kayarad DPHA.

The mixing ratio of the acidic group-containing polyfunctional (meth)acrylic compound (C-1) and another radical polymerizable compound (C-2) is not particularly limited and both of the acidic group-containing polyfunctional (meth)acrylic compound (C-1) and another radical polymerizable compound (C-2) are preferable to be added independently in an amount of at least 5% by mass, based on the total mass of the composition. That is, the content of the acidic group-containing polyfunctional (meth)acrylic compound (C-1) is preferably 5 to 95% by mass and the content of another radical polymerizable compound (C-2) is preferably 5 to 95% by mass, based on the total mass of the dye-containing negative working curable composition and the content of the acidic group-containing polyfunctional (meth)acrylic compound (C-1) is more preferably 10 to 90% by mass and the content of another radical polymerizable compound (C-2) is more preferably 10 to 90% by mass, based on the total mass of the composition.

Further, in the case where another radical polymerizable monomer is further added, its content is preferably at least 5% by mass based on the total mass of the dye-containing negative working curable composition.

In the first and the second embodiments, the contents of the radical polymerizable monomer in the dye-containing negative working curable composition is preferably in a range of 1 to 60% by mass and more preferably in a range of 10 to 50% by mass, based on the solid content of the composition. If the content is within the range, while the solubility of the unexposed part is kept favorably, good curability can be guaranteed.

In the second embodiment, a composition containing a preferable (or particularly preferable) combination of the (C-1) and the (C-2) as radical polymerizable monomer and either one or both of 2-(O-benzoyloxime)-1-[4-(phenylthio)phenyl]-1,2-octanedione and/or 1-(O-acetyloxime)-1-[9-ethyl-6-(2-methylbenzoyl)-9H-carbazol-3-yl]ethanone as a photo polymerization initiator is particularly preferable.

(D) Binder Resin

The dye-containing negative working curable composition of the invention may contain at least one kind binder resin, if necessary. The binder resin may be properly selected from conventionally known resin components if they are soluble in an organic solvent and organic high molecular weight polymers can be used preferably. Among them, an alkali-soluble binder is preferable and the alkali-soluble binder is not particularly limited as long as it is water-soluble or alkali-soluble and is preferably selected from the viewpoint of the thermal resistance, developability, and availability.

The alkali-soluble binder is preferably a linear organic polymer, soluble in organic solvents, and is able to be developed with a weak aqueous alkali solution. Such linear organic polymers include polymers having carboxylic acids at the side chains. Examples of the polymer having carboxylic acids at the side chains include methacrylic acid copolymers, acrylic acid copolymers, itaconic acid copolymers, crotonic acid copolymers, maleic acid copolymers and partially esterified maleic acid copolymers as described in JP-A Nos. 59-44615, 59-53836 and 59-71048, and Japanese Patent Application Publication (JP-B) Nos. 54-34327, 58-12577 and 54-25957. In particular, acidic cellulose derivatives having carboxylic acids at the side chains are preferable as the alkali-soluble binder.

Other preferable alkali-soluble binders include adducts of acid anhydrides to polymers having hydroxyl groups, polyhydroxystyrene resins, polysiloxane resins, poly(2-hydroxyethyl(meth)acrylate), polyvinyl pyrrolidone, polyethylene oxide and polyvinyl alcohol.

A monomer having a hydrophilic group may be copolymerized with the alkali-soluble binder. Examples of such monomer include alkoxyalkyl(meth)acrylate, hydroxyalkyl(meth)acrylate, glycerol(meth)acrylate, (meth)acrylamide, N-methylol acrylamide, secondary or tertiary alkyl acrylamide, dialkylaminoalkyl(meth)acrylate, morpholine(meth)acrylate, N-vinyl pyrrolidone, N-vinyl caprolactam, vinyl imidazole, vinyl triazole, methyl(meth)acrylate, ethyl(meth)acrylate, branched or linear propyl(meth)acrylate, branched or linear butyl(meth)acrylate, phenoxyhydroxypropyl(meth)acrylate, and the like.

Other preferable monomers having the hydrophilic group include those containing tetrahydrofurfulyl group, phosphate, phosphate ester, quaternary ammonium salt, ethyleneoxy chain, propyleneoxy chain, sulfonic acid group and salts thereof, and morpholinoethyl groups.

With a viewpoint of improving the cross-linking efficiency, alkali-soluble binder may be presented a polymerizable group on the side chain, and as the alkali-soluble binder, polymers containing an allyl group, a (meth)acrylic group, an aryloxy alkyl group, etc. on the side chain are also used.

Examples of the polymers having the polymerizable groups include KS resist-106 (manufactured by Osaka Organic chemical Industry Ltd.), and Cyclomer P series (manufactured by Daicel Chemical Industries, Ltd.). Further, for improving the strength of the cured film, an alcohol soluble nylon and a polyether of 2,2-bis(4-hydroxyphenyl)-propane and epichlorohydrin are also useful.

Among the alkali-soluble binders, polyhydroxystyrene resins, polysiloxane resins, acrylic resins, acrylamide resins and acrylic/acrylamide copolymer resins are preferred from the viewpoint of thermal resistance, and acrylic resins, acrylamide resins and acrylic/acrylamide copolymer resins are more preferred from the viewpoint of development controlling ability.

Examples of the acrylic resin include copolymers constituted by the monomers selected from benzyl(meth)acrylate, (meth)acrylic acid, hydroxyethyl(meth)acrylate and (meth)acrylamide, and KS resist-106 (manufactured by Osaka Organic Chemical Industry Ltd.), Cyclomer P series (manufactured by Daicel Chemical Industries, Ltd.).

The alkali-soluble binder is preferably polymers having a weight-average molecular weight by of 1000 to $2 \times 10^5$, more preferably polymer having weight-average molecular weight of 2000 to $1 \times 10^5$, and particularly polymer having weight-average molecular weight of 5000 to $5 \times 10^4$, measured by GPC and converted into polystyrene.

The binder resin is not necessarily an indispensable component in the invention, however it is sometimes added in order to improve the film surface property.

The content of the binder in the dye-containing negative working curable composition is preferably 1 to 40% by mass, more preferably 1 to 30% by mass, based on the solid content in the composition.

If the binder resin is added in the above-mentioned range, the binder resin can efficiently improve the evenness of the applied film and also is effective to suppress elution of the exposed part. If the amount of the binder resin is too large, the effect of suppressing the elution of the exposed part may be considerably deteriorated in some cases.

(E) Organic Solvent

The dye-containing negative working curable composition of the invention generally requires an organic solvent for preparation. The solvent is not particularly restricted so long as solubility of each component and coating properties of the dye-containing negative working curable composition is satisfied. The organic solvent is preferably selected considering solubility of the dye and alkali-soluble binder, coating properties and safety.

Examples of the preferable organic solvent include esters such as ethyl acetate, n-butyl acetate, isobutyl acetate, amyl formate, isoamyl acetate, butyl propionate, isopropyl butylate, ethyl butylate, butyl butylate, alkyl esters, methyl lactate, ethyl lactate, methyl oxylactate, ethyl oxylactate, butyl oxylactate, methyl methoxyacetate, ethyl methoxyacetate, butyl methoxyacetate, methyl ethoxyacetate, ethyl ethoxyacetate;

3-oxypropionic acid alkyl esters such as methyl 3-oxypropionate and ethyl 3-oxypropionate including methyl 3-methoxypropionate, ethyl 3-methoxypropionate, methyl 3-ethoxypropionate and ethyl 3-ethoxypropionate; 2-oxypropionic acid alkyl esters such as methyl 2-oxypropionate, ethyl 2-oxypropionate and propyl 2-oxypropionate including methyl 2-methoxypropyonate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, and ethyl 2-ethoxy-2-methylpropionate; methyl pyruvate, ethyl pyruvate, propyl pyruvate, methyl acetoacetate, ethyl acetoacetate, methyl 2-oxobutanate and ethyl 2-oxobutanate;

ethers such as diethyleneglycol dimethylether, tetrahydrofuran, ethyleneglycol monomethylether, ethyleneglycol monoethylether, methyl cellosolve acetate, ethyl cellosolve acetate, diethyleneglycol monomethylether, diethyleneglycol monoethylether, diethyleneglycol monobutylether, propyleneglycol methyl ether, propyleneglycol methylether acetate, propyleneglycol ethylether acetate, and propyleneglycol propylether acetate;

ketones such as methylethyl ketone, cyclohexanone, 2-heptanone and 3-heptanone; and aromatic hydrocarbons such as toluene and xylene.

The dye-containing negative working curable composition of the invention containing the above-mentioned components provides good rectangular patterns at a high sensitivity and is excellent in transmittance and has wide development latitude.

(F) Other Components

—Heat Polymerization Inhibitor—

In the dye-containing negative working curable composition of the invention, a heat polymerization inhibitor is preferably added in addition to the components above, and preferable examples thereof include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobenzimidazole, and the like.

—Cross-Linking Agent—

In the invention, a cross-linking agent may be used complementarily to obtain a film cured to a higher extent. In this case, at least one kind of the following cross-linking agents may be added.

The cross-linking agent available in the invention is not particularly restricted, so long as it is able to cure the layer by cross-linking reaction. Examples of the cross-linking agent include (a) epoxy resins, (b) melamine compounds, guanamine compounds, glycoluryl compounds or urea compounds substituted with at least one substituent selected from a methylol group, an alkoxymethyl group and an acyloxymethyl group, and (c) phenol compounds, naphthol compounds or hydroxyanthrathene compounds substituted with at least one substituent selected from a methylol group, an alkoxymethyl group and an acyloxymethyl group. A multifunctional epoxy resins are particularly preferable.

—Other Additives—

Various additives such as fillers, polymer compounds other than those above, surfactants, adherence enhancing agents, antioxidants, ultraviolet-absorbents and antiflocculants may be added, if necessary, to the dye-containing curable composition of the invention.

Specific examples of the additives include fillers such as glass and alumina; polymer compounds other than the binding resins such as polyvinyl alcohol, polyacrylic acid, polyethyleneglycol monoalkylether and polyfluoroalkyl acrylate; surfactants such as nonionic, cationic and anionic surfactants; adherence enhancing agents such as vinyl trimethoxy silane, vinyl triethoxy silane, vinyl tris(2-methoxyethoxy)silane, N-(2-aminoethyl)-3-aminopropylmethyldimetoxy silane, N-(2-aminoethyl)-3-aminopropyltrimethoxy silane, 3-aminopropyltriethoxy silane, 3-glycidoxypropyl trimethoxy silane, 3-glycidoxypropyl methyldimethoxy silane, 2-(3,4-epoxycyclohexyl)ethyl trimethoxy silane, 3-chloropropylmethyl dimethoxy silane, 3-chloropropyl trimethoxy silane, 3-methacryloxypropyl trimethoxy silane, and 3-mercaptopropyl trimethoxy silane; antioxidants such as 2,2-thiobis(4-methyl-6-t-butylphanol) and 2,6-di-t-butylphenol; ultraviolet-absorbents such as 2-(3-t-butyl-5-methyl-2-hydroxydiphenyl)-5-chlorobenzotriazole and alkoxybenzophenone; and antiflocculants such as sodium polyacrylate.

Organic carboxylic acids, preferably low molecular weight organic carboxylic acids with a molecular weight of 1000 or less may be added for enhancing alkali solubility of non-cured parts to further improving development ability of the dye-containing negative working curable composition of the invention.

Examples of the organic carboxylic acid include aliphatic monocarboxylic acids such as formic acid, acetic acid, propionic acid, butyric acid, valeric acid, pivalic acid, caproic acid, diethylacetic acid, enanthic acid and caprylic acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimetylmalonic acid, methylsuccinic acid, tetramethylsuccinic acid and citraconic acid; aliphatic tricarboxylic acid such as tricarballylic acid, aconitic acid and camphoronic acid; aromatic monocarboxylic acid such as benzoic acid, toluic acid, cuminic acid, hemelitic acid and mesitylenic acid; aromatic polycarboxylic acid such as phthalic acid, isophthalic acid, terephthalic acid, trimellitic acid, trimesic acid, mellophanic acid and pyromellitic acid; and other carboxylic acid such as phenylacetic acid, hydroatropic acid, hydrocinnamic acid, mandelic acid, phenylsuccinic acid, atropic acid, cinnamic acid, methyl cinnamate, benzyl cinnamate, cinnamilydenic acetic acid, cumalic acid and umbelic acid.

Among the component (D), specific examples can include those having a carboxyl group.

Exposure of the dye-containing negative working curable composition of the invention may be carried out by using any method such as a proximity method, a mirror projection method, and a stepper method and exposure is preferable to be carried out by the stepper method (a reduction-projection exposure method using a reduction-projection exposure apparatus). This stepper method is a method for forming patterns by carrying out exposure while altering the exposure amount step by step and is capable of making the rectangular geometry of the patterns, which is one effect of the invention, better at the time of executing stepper exposure. The exposure apparatus to be used for the stepper exposure may be, for example, an i-line stepper (trade name: FPA-3000i5+, manufactured by Canon Inc.).

The dye-containing negative working curable composition of the invention may be suitably used for forming colored picture element such as color filters used for liquid crystal displays (LCD) and solid state image pick-up elements (for example CCD and CMOS), and for preparing printing inks, ink-jet inks, paints, and the like.

<<Color Filter and Method of Producing Thereof>>

Then, a color filter of the invention will be described in detail along with method of producing thereof.

In the method of producing the color filter of the invention, the above-mentioned dye-containing negative working curable composition of the invention may be used. Use of the dye-containing negative working curable composition of the invention gives excellent developability and high hardness at a high sensitivity and accordingly makes it easy to produce a color filter having fine patterns with good shape and high resolution.

The method of producing the color filter of the invention comprises coating the dye-containing negative working curable composition of the invention onto a support, then exposing through a mask, and developing to form a pattern image.

Specifically, a radiation-sensitive composition layer is formed by applying the dye-containing negative working curable composition of the invention onto a substrate by a coating process such as rotation coating, flow casting coating and roll coating. Then, the layer is exposed through a given mask pattern, followed by developing with a developer. Consequently, the colored pattern is preferably formed (image forming step). Further, the method of producing the color filter of the invention may, if necessary, comprise curing the colored pattern by heating and/or exposing (curing step).

The color filter comprising desired hues may be prepared by repeating the plural times of the image forming steps (and curing step, if necessary) corresponding to the number of the hues. Preferable light or radiation used for the purpose above is particularly an ultraviolet light such as g-ray, h-ray, or i-ray.

Examples of the substrate include a soda glass, Pyrex (R) glass and quartz glass, which are used for a liquid crystal displays, those on which a transparent conductive film is adhered, and the substrate of photoelectric conversion elements used for the imaging element such as, for example, a silicone substrate and complementary metal oxide film semiconductor (CMOS). Black stripes for isolating each picture element may be formed on these substrates.

An undercoat layer may be provided on the substrate for improving adhesive property to the upper layers, for preventing diffusion of substances, and for planarizing the surface of the substrate.

Any developers may be used so long as they comprise a composition that is able to dissolve non-cured portions of the dye-containing negative working curable composition of the invention while the cured portions are left undissolved. Specifically, a combination of various organic solvents and an aqueous alkali solution may be used. The organic solvents used for preparing the dye-containing negative working curable composition of the invention may be also used for the developer.

As the aqueous alkali solution, an aqueous alkali solution which dissolved an alkali compound in the concentration of 0.001 to 10% by mass (preferably 0.01 to 1% by mass) is preferred. Examples of the alkali compound include sodium hydroxide, potassium hydroxide, sodium carbonate, sodium silicate, sodium methanesilicate, ammonia water, ethylamine, diethylamine, dimethylethanolamine, tetramethylammonium hydroxide, tetraethylammonium hydroxide, choline, pyrrole, piperidine, and 1,8-diazabicyclo-[5.4.0]-7-undecene. When a developing solution prepared from such an aqueous alkali solution was used, generally after the development, the developing solution is washed with water.

The color filter of the invention can be used for the liquid crystal display (LCD) and solid state image pick-up element (for example CCD and CMOS). The color filter is suitable for a high resolution CCD element and CMOS having 1,000,000 picture elements or more. The color filter of the invention may be used as the color filter is disposed between the light-receiving part of the picture elements constituting the CCD and micro-lenses for converging the light.

EXAMPLES

Hereinbelow, the invention will be described in detail by way of Examples. However, the invention is not limited to these Examples as long as the scope of the invention is not impaired. Unless noted differently, the "part" is based on the mass.

Examples 1 to 9 and Comparative Examples 1 to 3

1) Preparation of Dye-Containing Negative Working Curable Composition

The compounds in the following Table 1 were mixed and dissolved to prepare a dye-containing negative working curable composition of the invention.

TABLE 1

|  | (C) Radical polymerizable monomer | (A) Organic solvent-soluble dye | (B) Photo polymerization initiator | (D) Alkali-soluble binder | (E) Organic solvent |
|---|---|---|---|---|---|
| Example 1 | Monomer A (0.85 g) | Valifast Yellow 1101 (0.8 g) | Oxime A (0.25 g) | — | Ethyl lactate (8 g) |
| Example 2 | Monomer B (0.85 g) | Valifast Yellow 1101 (0.8 g) | Oxime A (0.25 g) | — | Cyclohexanone (8 g) |

TABLE 1-continued

|  | (C) Radical polymerizable monomer | (A) Organic solvent-soluble dye | (B) Photo polymerization initiator | (D) Alkali-soluble binder | (E) Organic solvent |
|---|---|---|---|---|---|
| Example 3 | Monomer A (0.85 g) | Valifast Yellow 1101 (0.26 g) Acid Red 57 (0.54 g) | Oxime B (0.31 g) | — | Cyclohexanone (8 g) |
| Example 4 | Monomer A (0.85 g) | Valifast Blue 2620 (0.8 g) | Oxime A (0.25 g) | — | Cyclohexanone (8 g) |
| Example 5 | Monomer B (0.85 g) | Valifast Blue 2620 (0.4 g) Acid violet 7 (0.3 g) | Oxime B (0.28 g) | — | Cyclohexanone (8 g) |
| Example 6 | Monomer A (0.85 g) | Valifast Blue 2620 (0.8 g) | TAZ-107 (0.25 g) | — | Cyclohexanone (8 g) |
| Example 7 | Monomer A (0.6 g) | Valifast Blue 2620 (0.8 g) | Oxime A (0.25 g) | Resin A (0.2 g) | Cyclohexanone (8 g) |
| Example 8 | Monomer E (0.85 g) | Valifast Blue 2620 (0.4 g) Acid violet 7 (0.3 g) | Oxime A (0.28 g) | — | Cyclohexanone (8 g) |
| Example 9 | Monomer F (0.85 g) | Valifast Blue 2620 (0.4 g) Acid violet 7 (0.3 g) | Oxime A (0.28 g) | — | Cyclohexanone (8 g) |
| Comparative example 1 | Monomer C (0.85 g) | Valifast Yellow 1101 (0.8 g) | Oxime A (0.25 g) | — | Ethyl lactate (8 g) |
| Comparative example 3 | Monomer D (6.7 g) | Valifast Yellow 1101 (6.0 g) | TAZ-107 (0.5 g) | Resin A (4.4 g) | Ethyl lactate (8 g) |

*Alkali-soluble binder was the binder resin (D).
The components (A) to (E) in Table 1 are as follows.
*Resin A: benzyl methacrylate/methacrylic acid copolymer (= 80/20 [molar ratio])
*Monomer A: TO-2359 manufactured by Toagosei Co., Ltd. (acid value: 26.3 mgKOH/g, viscosity (at 25° C.): 12,400 mPa · s)
*Monomer B: TO-2360 manufactured by Toagosei Co., Ltd. (acid value: 66.8 mgKOH/g, viscosity (at 25° C.): 44,200 mPa · s)
*Monomer C: TO-1382 manufactured by Toagosei Co., Ltd. (acid value: 23.6 mgKOH/g, viscosity (at 25° C.): 10,900 mPa · s)
*Monomer D: Kayarad DPHA manufactured by Nippon Kayaku Co., Ltd. (acid value: 0 mgKOH/g, viscosity (at 25° C.): 7,000 mPa · s)
*Monomer E: TO-2349 manufactured by Toagosei Co., Ltd. (acid value: 67.8 mgKOH/g, viscosity (at 25° C.): 43,300 mPa · s)
*Monomer F: TO-2348 manufactured by Toagosei Co., Ltd. (acid value: 25.8 mgKOH/g, viscosity (at 25° C.): 12,400 mPa · s)
*TAZ-107: manufactured by Midori Kagaku Co., Ltd.
*Oxime A: 2-(O-benzoyloxime)-1-[4-(phenylthio)phenyl]-1,2-octanedione, manufactured by Ciba Specialty Chemicals Inc.
*Oxime B: 1-(O-acetyloxime)-1-[9-ethyl-6-(2-methylbenzoyl)-9H-carbazol-3-yl]ethanone, manufactured by Ciba Specialty Chemicals Inc.

2) Production of Undercoat Layer-Bearing Glass Substrate

A cured film (undercoat layer) was formed by applying resist CT-2000L solution (manufactured by Fuji Film Electronics Materials Co., Ltd.) in proper thickness to give a film thickness of 2 μm onto a silicon wafer substrate by a spin coater and heating and drying the applied layer at 220° C. for 1 hour.

3) Exposure and Development (Image Formation) of Dye-Containing Negative Working Curable Composition Each of the dye-containing negative working curable compositions obtained in the above process 1) was applied onto the undercoat layer of each of the different undercoat layer-bearing silicon wafers obtained in the process 2) in proper thickness to give a film thickness of 1 μm by a spin coater and pre-baked at 100° C. for 120 seconds. Next, the exposure was carried out by changing the exposure amount of light with wavelength of 365 nm through a mask with line width of 2 μm by using an i-line reduction-projection exposure apparatus. After the light radiation, development was carried out using a 100% CD-2000 developer (manufactured by Fuji Film Electronics Materials Co., Ltd.) in condition of 23° C. for 60 seconds. Next, after washing treatment for 20 seconds with running water, the pattern image (the color filter) was obtained by spin drying. The image formation was confirmed by ordinary methods such as an optical microscope and SEM photograph observation.

4) Evaluation

The respective pattern images obtained using the dye-containing negative working curable compositions of respective Examples and Comparative Examples were evaluated as follows. The evaluation results were as shown in Table 2.

—1. Sensitivity—

The exposure amount at which the width between the dots and spaces became 1:1 in the 2 μm-width patterns was set to be a proper exposure amount and the exposure amount was defined as the sensitivity. As the value is smaller, the sensitivity is higher and shows better sensitivity.

—2. Profile—

The cross-sectional shapes (the cross-sectional view cut by a plane including the line width direction) of the pattern images were observed with eyes by using the SEM images at the proper exposure amount of 1. and those having rectangular profile were marked with "A" and those having round top (round head) shape were marked with "B".

TABLE 2

|  | Sensitivity [mJ/cm$^2$] | Profile |
|---|---|---|
| Example 1 | 350 | A |
| Example 2 | 400 | A |
| Example 3 | 450 | A |
| Example 4 | 500 | A |
| Example 5 | 400 | A |

TABLE 2-continued

|  | Sensitivity [mJ/cm$^2$] | Profile |
| --- | --- | --- |
| Example 6 | 650 | A |
| Example 7 | 700 | A |
| Example 8 | 400 | A |
| Example 9 | 400 | A |
| Comparative Example 1 | 1200 | B |
| Comparative Example 3 | 1100 | B |

As shown in Table 2, Examples all showed good sensitivity and the cross-sectional shape of the formed pattern images had good rectangular shape. On the other hand, Comparative Examples were all considerably inferior in the sensitivity and the cross-sectional shape of the pattern images had poor rectangular shape.

Additionally, in the case of using above-mentioned acidic group-containing polyfunctional (meth)acrylic compound having acid value of 25 mgKOH/g or more as another monomer other than the radical polymerizable monomers used in above-mentioned Examples, a similar effect to those of Examples of the invention was caused and good sensitivity was obtained and pattern having good rectangular cross-sectional shape could be formed.

Examples 10 to 18 and Comparative Examples 4 to 6

1) Preparation of Dye-Containing Negative Working Curable Composition

The compounds in the following Table 3 were mixed and dissolved to prepare a dye-containing negative working curable composition of the invention.

TABLE 3

|  | Radical polymerizable monomer-1 | Radical polymerizable monomer-2 | (A) Organic solvent-soluble dye | (B) Photo polymerization initiator | (D) Alkali-soluble binder | (E) Organic solvent |
| --- | --- | --- | --- | --- | --- | --- |
| Example 10 | Monomer A (0.64 g) | Monomer C (0.21 g) | Valifast Yellow 1101 (0.8 g) | Oxime A (0.25 g) | — | Ethyl lactate (8 g) |
| Example 11 | Monomer B (0.64 g) | Monomer C (0.21 g) | Valifast Yellow 1101 (0.8 g) | Oxime A (0.25 g) | — | Cyclohexanone (8 g) |
| Example 12 | Monomer B (0.51 g) | Monomer D (0.34 g) | Valifast Yellow 1101 (0.26 g) Acid Red 57 (0.54 g) | Oxime B (0.31 g) | — | Cyclohexanone (8 g) |
| Example 13 | Monomer A (0.51 g) | Monomer C (0.34 g) | Valifast Blue 2620 (0.8 g) | Oxime A (0.25 g) | — | Cyclohexanone (8 g) |
| Example 14 | Monomer A (0.34 g) | Monomer D (0.51 g) | Valifast Blue 2620 (0.4 g) Acid violet 7 (0.3 g) | Oxime B (0.28 g) | — | Cyclohexanone (8 g) |
| Example 15 | Monomer A (0.09 g) | Monomer C (0.76 g) | Valifast Blue 2620 (0.8 g) | TAZ-107 (0.25 g) | — | Cyclohexanone (8 g) |
| Example 16 | Monomer A (0.4 g) | Monomer D (0.2 g) | Valifast Blue 2620 (0.8 g) | Oxime A (0.25 g) | Resin A (0.2 g) | Cyclohexanone (8 g) |
| Example 17 | Monomer E (0.34 g) | Monomer D (0.51 g) | Valifast Blue 2620 (0.4 g) Acid violet 7 (0.3 g) | Oxime A (0.28 g) | — | Cyclohexanone (8 g) |
| Example 18 | Monomer F (0.51 g) | Monomer D (0.34 g) | Valifast Blue 2620 (0.4 g) Acid violet 7 (0.3 g) | Oxime A (0.28 g) | — | Cyclohexanone (8 g) |
| Comparative Example 5 | Monomer C (0.85 g) | — | Valifast Yellow 1101 (0.8 g) | Oxime B (0.25 g) | — | Cyclohexanone (8 g) |
| Comparative Example 6 | Monomer C (0.4 g) | Monomer D (0.2 g) | Valifast Yellow 1101 (6.0 g) | TAZ-107 (0.5 g) | Resin A (0.2 g) | Ethyl lactate (8 g) |

*Alkali-soluble binder was the binder resin (D).

The components (A) to (E) in Table 3 are as follows.

*Resin A: benzyl methacrylate/methacrylic acid copolymer (= 80/20 [molar ratio])

*Monomer A: TO-2359 manufactured by Toagosei Co., Ltd. (acid value: 26.3 mgKOH/g, viscosity (at 25° C.): 12,400 mPa · s)

*Monomer B: TO-2360 manufactured by Toagosei Co., Ltd. (acid value: 66.8 mgKOH/g, viscosity (at 25° C.): 44,200 mPa · s)

*Monomer C: TO-1382 manufactured by Toagosei Co., Ltd. (acid value: 23.6 mgKOH/g, viscosity (at 25° C.): 10,900 mPa · s)

*Monomer D: Kayarad DPHA manufactured by Nippon Kayaku Co., Ltd. (acid value: 0 mgKOH/g, viscosity (at 25° C.): 7,000 mPa · s)

*Monomer E: TO-2349 manufactured by Toagosei Co., Ltd. (acid value: 67.8 mgKOH/g, viscosity (at 25° C.): 43,300 mPa · s)

*Monomer F: TO-2348 manufactured by Toagosei Co., Ltd. (acid value: 25.8 mgKOH/g, viscosity (at 25° C.): 12,400 mPa · s)

*TAZ-107: manufactured by Midori Kagaku Co., Ltd.

*Oxime A: 2-(O-benzoyloxime)-1-[4-(phenylthio)phenyl]-1,2-octanedione, manufactured by Ciba Specialty Chemicals Inc.

*Oxime B: 1-(O-acetyloxime)-1-[9-ethyl-6-(2-methylbenzoyl)-9H-carbazol-3-yl]ethanone, manufactured by Ciba Specialty Chemicals Inc.

2) Production of Undercoat Layer-Bearing Glass Substrate

A cured film (undercoat layer) was formed by applying resist CT-2000L solution (manufactured by Fuji Film Electronics Materials Co., Ltd.) in proper thickness to give a film thickness of 2 μm onto a silicon wafer substrate by a spin coater and heating and drying the applied layer at 220° C. for 1 hour.

3) Exposure and Development (Image Formation) of Dye-Containing Negative Working Curable Composition Each of the dye-containing negative working curable compositions obtained in the above process 1) was applied onto the undercoat layer of each of the different undercoat layer-bearing silicon wafers obtained in the process 2) in proper thickness to give a film thickness of 1 μm by a spin coater and pre-baked at 100° C. for 120 seconds. Next, the exposure was carried out by changing the exposure amount of light with wavelength of 365 run through a mask with line width of 2 μm by using an i-line reduction-projection exposure apparatus. After the light radiation, development was carried out using a 100% CD-2000 developer (manufactured by Fuji Film Electronics Materials Co., Ltd.) in condition of 23° C. for 60 seconds. Next, after washing treatment for 20 seconds with running water, the pattern image (the color filter) was obtained by spin drying. The image formation was confirmed by ordinary methods such as an optical microscope and SEM photograph observation.

4) Evaluation

The respective pattern images obtained using the dye-containing negative working curable compositions of respective Examples and Comparative Examples were evaluated as follows. The evaluation results were as shown in Table 4.

—1. Sensitivity—

The exposure amount at which the width between the dots and spaces became 1:1 in the 2 μm-width patterns was set to be a proper exposure amount and the exposure amount was defined as the sensitivity. As the value is smaller, the sensitivity is higher and shows better sensitivity.

—2. Profile—

The cross-sectional shapes (the cross-sectional view cut by a plane including the line width direction) of the pattern images were observed with eyes by using the SEM images at the proper exposure amount of 1. and those having rectangular profile were marked with "A" and those having round top (round head) shape were marked with "B".

TABLE 4

|  | Sensitivity [mJ/cm²] | Profile |
| --- | --- | --- |
| Example 10 | 450 | A |
| Example 11 | 400 | A |
| Example 12 | 400 | A |
| Example 13 | 450 | A |
| Example 14 | 450 | A |
| Example 15 | 600 | A |
| Example 16 | 800 | A |
| Example 17 | 450 | A |
| Example 18 | 450 | A |
| Comparative Example 5 | 1250 | B |
| Comparative Example 6 | 1150 | B |

As shown in Table 4, Examples all showed good sensitivity and the cross-sectional shape of the formed pattern images had good rectangular shape. On the other hand, Comparative Examples were considerably inferior in the sensitivity and the cross-sectional shape of the pattern images had poor rectangular shape.

Additionally, in the case of using in combination above-mentioned radical polymerizable monomers selected from the above-mentioned (C-1) and (C-2) as another monomer other than two kinds of the radical polymerizable monomers used in combination for the above-mentioned Examples, a similar effect to those of Examples of the invention was caused and good sensitivity was obtained and pattern having good rectangular cross-sectional shape could be formed.

Accordingly, the invention provides a dye-containing negative working curable composition suitable for a constitution in which a dye is used a dye as a coloring agent, having high sensitivity, and usable for forming fine patterns with rectangular cross-sectional shapes. The invention also provides a color filter (particularly a color filter for a solid state image pick-up element) capable of being produced at high productivity (high cost performance) and having patterns with high sharpness (particularly, whose rectangular shape is a good cross-sectional shape) and high resolution, and a method of producing the same.

The invention is particularly effective at the time of pattern formation by stepper exposure.

The present invention includes the following embodiment.

<1> A dye-containing negative working curable composition comprising (A) a dye, (B) a photo polymerization initiator, and (C) an acidic group-containing polyfunctional (meth)acrylic compound having an acid value of 25 mgKOH/g or more as a radical polymerizable monomer.

<2> A dye-containing negative working curable composition comprising at least (A) a dye, (B) a photo polymerization initiator, and (C) a radical polymerizable monomer, wherein the radical polymerizable monomer (C) comprises at least (C-1) an acidic group-containing polyfunctional (meth)acrylic compound having an acid value of 25 mgKOH/g or more and (C-2) another radical polymerizable compound other than (C-1).

<3> The dye-containing negative working curable composition as described in <1> or <2> further comprising (D) a binder resin.

<4> The dye-containing negative working curable composition as described in any one of <1> to <3>, wherein the dye (A) is a mixture comprising at least two kinds of dyes having different absorption properties.

<5> The dye-containing negative working curable composition as described in any one of <1> to <4>, wherein the acidic value of the acidic group-containing polyfunctional (meth)acrylic compound is in a range of 50 mgKOH/g to 100 mgKOH/g.

<6> The dye-containing negative working curable composition as described in any one of <1> and <3> to <5>, wherein the photo polymerization initiator (B) is an oxime-based photo polymerization initiator, and the acidic group-containing polyfunctional (meth)acrylic compound having an acid value of 25 mgKOH/g or more (C) is a compound obtained by introducing an acidic group by reaction onto a hydroxyl group of a hydroxyl group-containing pentafunctional acrylic compound.

<7> The dye-containing negative working curable composition as described in any one of <2> to <5>, wherein the radical polymerizable compound (C-2) is a compound having a boiling point of 100° C. or more under normal pressure and having at least one addition polymerizable ethylenic double bond.

<8> The dye-containing negative working curable composition as described in <7>, wherein a (meth)acryloyl group is contained as the addition polymerizable ethylenic double bond.

<9> The dye-containing negative working curable composition as described in any one of <1> to <8>, wherein the photo polymerization initiator (B) is 2-(O-benzoyloxime)-1-[4-(phenylthio)phenyl]-1,2-octanedione and/or 1-(O-acetyloxime)-1-[9-ethyl-6-(2-methylbenzoyl)-9H-carbazol-3-yl]ethanone.

<10> A color filter formed by using the dye-containing negative working curable composition as described in any one of <1> to <9>.

<11> A method of producing a color filter comprising:
coating the dye-containing negative working curable composition as described in any one of <1> to <9> onto a support; then
exposing the dye-containing negative working curable composition through a mask; and
developing the dye-containing negative working curable composition to form a patterned image.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A dye-containing negative working curable composition comprising (A) a dye, (B) an oxime photo polymerization initiator, and (C) an acidic group-containing polyfunctional (meth)acrylic compound having an acid value of 25 mgKOH/g or more as a radical polymerizable monomer,
wherein the photo polymerization initiator (B) is 2-(O-benzoyloxime)-1-[4-(phenylthio)phenyl]-1,2-octanedione and/or 1-(O-acetyloxime)-1-[9-ethyl-6-2-methylbenzoyl)-9H-carbazol-3-yl]ethanone, and
the acidic group-containing polyfunctional (meth)acrylic compound having an acid value of 25 mgKOH/g or more (C) is a compound obtained by introducing an acidic group by reaction onto a hydroxyl group of a hydroxyl group-containing pentafunctional acrylic compound.

2. The dye-containing negative working curable composition according to claim 1 further comprising (D) a binder resin.

3. The dye-containing negative working curable composition according to claim 1, wherein the dye (A) is a mixture comprising at least two kinds of dyes having different absorption properties.

4. The dye-containing negative working curable composition according to claim 1, wherein the acidic value of the acidic group-containing polyfunctional (meth)acrylic compound is in a range of 50 mgKOH/g to 100 mgKOH/g.

5. A color filter formed by using the dye-containing negative working curable composition according to claim 1.

6. A method of producing a color filter comprising:
coating the dye-containing negative working curable composition according to claim 1 onto a support; then
exposing the dye-containing negative working curable composition through a mask; and
developing the dye-containing negative working curable composition to form a patterned image.

7. The method of producing a color filter according to claim 6, wherein the dye-containing negative working curable composition is exposed to g-ray, h-ray, or i-ray.

8. A dye-containing negative working curable composition comprising at least (A) a dye, (B) an oxime photo polymerization initiator, and (C) a radical polymerizable monomer, wherein the radical polymerizable monomer (C) comprises at least (C-1) an acidic group-containing polyfunctional (meth)acrylic compound having an acid value of 25 mgKOH/g or more and (C-2) another radical polymerizable compound other than (C-1),
wherein the photo polymerization initiator (B) is 2-(O-benzoyloxime)-1-[4-(phenylthio)phenyl]-1,2-octanedione and/of 1-(O-acetyloxime)-1-[9-ethyl-6-(2-methylbenzoyl)-9H-carbazol-3-yl]ethanone,
the acidic group-containing polyfunctional (meth)acrylic compound having an acid value of 25 mgKOH/g or more (C-1) is a compound obtained by introducing an acidic group by reaction onto a hydroxyl group of a hydroxyl group-containing pentafunctional acrylic compound, and
the radical polymerizable compound (C-2) is a compound having a boiling point of 100° C. or more under normal pressure and having at least one addition polymerizable ethylenic double bond.

9. The dye-containing negative working curable composition according to claim 8 further comprising (D) a binder resin.

10. The dye-containing negative working curable composition according to claim 8, wherein the dye (A) is a mixture comprising at least two kinds of dyes having different absorption properties.

11. The dye-containing negative working curable composition according to claim 8, wherein the acidic value of the acidic group-containing polyfunctional (meth)acrylic compound (C-1) is in a range of 50 mgKOH/g to 100 mgKOH/g.

12. The dye-containing negative working curable composition according to claim 8, wherein a (meth)acryloyl group is contained as the addition polymerizable ethylenic double bond.

13. A color filter formed by using the dye-containing negative working curable composition according to claim 8.

14. A method of producing a color filter comprising:
coating the dye-containing negative working curable composition according to claim 8 onto a support; then
exposing the dye-containing negative working curable composition through a mask; and
developing the dye-containing negative working curable composition to form a patterned image.

15. The method of producing a color filter according to claim 14, wherein the dye-containing negative working curable composition is exposed to g-ray, h-ray, or i-ray.

16. A dye-containing negative working curable composition comprising (A) a dye, (B) an oxime photo polymerization initiator, and (C) an acidic group-containing polyfunctional (meth)acrylic compound as a radical polymerizable monomer,
wherein the acidic group-containing polyfunctional (meth)acrylic compound (C) has an acidic value in a range of 50 mgKOH/g to 100 mgKOH/g.

17. The dye-containing negative working curable composition according to claim 16 further comprising (D) a binder resin.

18. The dye-containing negative working curable composition according to claim 16, wherein the dye (A) is a mixture comprising at least two kinds of dyes having different absorption properties.

19. The dye-containing negative working curable composition according to claim 16, wherein the photo polymerization initiator (B) is an oxime-based photo polymerization initiator, and the acidic group-containing polyfunctional (meth)acrylic compound (C) is a compound obtained by introducing an acidic group by reaction onto a hydroxyl group of a hydroxyl group-containing pentafunctional acrylic compound.

20. The dye-containing negative working curable composition according to claim 16, wherein the photo polymerization initiator (B) is 2-(O-benzoyloxime)-1-[4-(phenylthio) phenyl]-1,2-octanedione and/or 1-(O-acetyloxime)-1-[9-ethyl-6-(2-methylbenzoyl)-9H-carbazol-3-yl]ethanone.

21. A color filter formed by using the dye-containing negative working curable composition according to claim 16.

22. A method of producing a color filter comprising:
coating the dye-containing negative working curable composition according to claim 16 onto a support; then
exposing the dye-containing negative working curable composition through a mask; and
developing the dye-containing negative working curable composition to form a patterned image.

23. The method of producing a color filter according to claim 22, wherein the dye-containing negative working curable composition is exposed to g-ray, h-ray, or i-ray.

24. A dye-containing negative working curable composition comprising at least (A) a dye, (B) an oxime photo polymerization initiator, and (C) a radical polymerizable monomer, wherein the radical polymerizable monomer (C) comprises at least (C-1) an acidic group-containing polyfunctional (meth)acrylic compound and (C-2) another radical polymerizable compound other than (C-1),
wherein the acidic group-containing polyfunctional (meth) acrylic compound (C-1) has an acidic value in a range of 50 mgKOH/g to 100 mgKOH/g.

25. The dye-containing negative working curable composition according to claim 24 further comprising (D) a binder resin.

26. The dye-containing negative working curable composition according to claim 24, wherein the dye (A) is a mixture comprising at least two kinds of dyes having different absorption properties.

27. The dye-containing negative working curable composition according to claim 24, wherein the photo polymerization initiator (B) is an oxime-based photo polymerization initiator, and the acidic group-containing polyfunctional (meth)acrylic compound (C-1) is a compound obtained by introducing an acidic group by reaction onto a hydroxyl group of a hydroxyl group-containing pentafunctional acrylic compound.

28. The dye-containing negative working curable composition according to claim 24, wherein the radical polymerizable compound (C-2) is a compound having a boiling point of 100° C. or more under normal pressure and having at least one addition polymerizable ethylenic double bond.

29. The dye-containing negative working curable composition according to claim 28, wherein a (meth)acryloyl group is contained as the addition polymerizable ethylenic double bond.

30. The dye-containing negative working curable composition according to claim 24, wherein the photo polymerization initiator (B) is 2-(O-benzoyloxime)-1-[4-(phenylthio) phenyl]-1,2-octanedione and/or 1-(O-acetyloxime)-1-[9-ethyl-6-(2-methylbenzoyl)-9H-carbazol-3-yl]ethanone.

31. A color filter formed by using the dye-containing negative working curable composition according to claim 24.

32. A method of producing a color filter comprising:
coating the dye-containing negative working curable composition according to claim 24 onto a support; then
exposing the dye-containing negative working curable composition through a mask; and
developing the dye-containing negative working curable composition to form a patterned image.

33. The method of producing a color filter according to claim 32, wherein the dye-containing negative working curable composition is exposed to g-ray, h-ray, or i-ray.

* * * * *